US012586435B2

(12) United States Patent
Huber

(10) Patent No.: US 12,586,435 B2
(45) Date of Patent: Mar. 24, 2026

(54) SENSOR ELEMENT, TEST DEVICE, AND METHOD FOR TESTING A DATA CARRIER HAVING A SPIN RESONANCE FEATURE

(71) Applicant: GIESECKE+DEVRIENT CURRENCY TECHNOLOGY GMBH, Munich (DE)

(72) Inventor: Stephan Huber, Munich (DE)

(73) Assignee: GIESECKE+DEVRIENT CURRENCY TECHNOLOGY GMBH, Munich (DE)

( * ) Notice: Subject to any disclaimer, the term of this patent is extended or adjusted under 35 U.S.C. 154(b) by 0 days.

(21) Appl. No.: 18/863,047

(22) PCT Filed: May 5, 2023

(86) PCT No.: PCT/EP2023/025209
§ 371 (c)(1),
(2) Date: Nov. 5, 2024

(87) PCT Pub. No.: WO2023/213438
PCT Pub. Date: Nov. 9, 2023

(65) Prior Publication Data
US 2025/0316124 A1     Oct. 9, 2025

(30) Foreign Application Priority Data
May 6, 2022    (DE) ..................... 10 2022 001 598.6

(51) Int. Cl.
G07D 7/04          (2016.01)
G01R 33/44          (2006.01)

(52) U.S. Cl.
CPC ............. G07D 7/04 (2013.01); G01R 33/443 (2013.01)

(58) Field of Classification Search
CPC ................................ G07D 7/04; G01R 33/443
(Continued)

(56) References Cited

U.S. PATENT DOCUMENTS

| | | | |
|---|---|---|---|
| 5,149,946 A | 9/1992 | Jerome et al. | |
| 9,448,290 B2 | 9/2016 | Annino et al. | |

(Continued)

FOREIGN PATENT DOCUMENTS

| | | |
|---|---|---|
| DE | 102020006201 A1 | 4/2022 |
| KR | 20210054222 A | 5/2021 |

OTHER PUBLICATIONS

Rahim et al. "Antenna Array at 2.4 GHz for Wireless LAN System Using Point to Point Communication", 2007 Asia-Pacific Conference on Applied Electromagnetics Proceedings, Dec. 4-7, 2007, pp. 1-4.

(Continued)

*Primary Examiner* — Daniel A Hess
(74) *Attorney, Agent, or Firm* — Workman Nydegger

(57) ABSTRACT

A sensor element is for testing a flat data carrier having a spin resonance feature. The sensor element includes a magnetic core having an air gap, which is delimited by two pole surfaces of the magnetic core and into which the flat data carrier can be inserted in order to be tested, a polarization device for generating a static magnetic flux in the air gap, and a resonator device for exciting the spin resonance feature of the data carrier to be tested in the air gap. The resonator device has a signal source and a plurality of stripline resonators which are simultaneously fed from the signal source, and the stripline resonators are formed in a planar manner with a main extension plane which is plan-parallel to at least one of the pole surfaces of the magnetic core.

19 Claims, 2 Drawing Sheets

(58) Field of Classification Search
USPC ........................................................ 235/449
See application file for complete search history.

(56) References Cited

U.S. PATENT DOCUMENTS

| | | | |
|---|---|---|---|
| 2011/0050225 A1* | 3/2011 | Prisner | G01R 33/62 |
| | | | 324/307 |
| 2014/0117988 A1 | 5/2014 | Annino et al. | |
| 2023/0375487 A1 | 11/2023 | Huber | |

OTHER PUBLICATIONS

German Search Report from corresponding German Patent Application No. DE102022001598.6, Oct. 19, 2022.
International Search Report from corresponding PCT Application No. PCT/EP2023/025209, Jul. 27, 2023.

* cited by examiner

SENSOR ELEMENT, TEST DEVICE, AND METHOD FOR TESTING A DATA CARRIER HAVING A SPIN RESONANCE FEATURE

BACKGROUND

The invention relates to a sensor element for testing the authenticity of a planar data carrier, in particular a banknote, having a spin resonance feature. The invention also relates to a test apparatus having such a sensor element and to a method for testing authenticity by way of such a sensor element or such a test apparatus.

Data carriers, such as value or identification documents, but also other valuable objects, such as brand-name articles, are often provided with security elements that allow the data carriers to be authenticated and that also serve as protection against unauthorized reproduction. The use of security elements having spin resonance features for safeguarding documents and other data carriers within the scope of machine-based authenticity testing is known. The security elements are provided with substances that have a spin resonance signature. The spin resonance signatures that can be used for authenticity testing include, in particular, nuclear magnetic resonance (NMR) effects, electron spin resonance (ESR) effects, and ferromagnetic resonance (FMR) effects.

To detect the spin resonance signatures when testing banknotes, it is usual for three different magnetic fields to be created in the measurement region of a banknote processing machine, for example. Specifically, this relates to a quasi-static polarization field $B_0$ which extends parallel to the axial direction (z-direction) of the air gap in a magnetic circuit. A second magnetic field is formed by a modulation field $B_{mod}$, which also runs parallel to the z-axis and typically has a frequency $f_{mod}$ in the kHz range. For the excitation of transitions between the split spin energy levels of the spin resonance signature substances, an excitation field $B_1$ is provided, which is polarized perpendicular to the $B_0$ direction. In this context, the excitation field oscillates at the resonant frequency of the material, which is also referred to as Larmor frequency and which is proportional to the polarization field $B_0$.

To create the polarization field $B_0$, a magnetic circuit is often used that directs the magnetic flux of permanent magnets and/or coils to an air gap in which the testing of the planar data carriers takes place.

A radiofrequency resonator, for example a stripline resonator, is used to create the excitation field $B_1$. This is a conductive structure of characteristic length l, which is arranged on a carrier. If the wavelength $\lambda$ of the incoupled radiofrequency signal matches the dimension l of the conductive structure during the authenticity test, then a standing wave can form in the resonator, and the stripline resonator is in resonance with the excitation frequency belonging to the wavelength $\lambda$. Since the extent of a stripline resonator is significantly greater in the plane of the carrier than perpendicular thereto, this is also referred to as the plane of the stripline resonator, which corresponds to the plane of the carrier.

A sensor element for testing a data carrier, for instance a banknote, on the basis of a stripline resonator generally has a limited signal-to-noise ratio (SNR), which is proportional to the number of spins of the spin resonance feature in a sensitive region. Since the sensitive region scales with the size of the resonator, the signal-to-noise ratio can in principle be improved by increasing the size of the resonator. The length of the resonator determines the resonant frequency thereof, and so the resonator length cannot be increased arbitrarily in the event of a given resonant frequency matched to the Larmor frequency of the feature substance to be measured. For example, if a suitable multiple of the $\lambda/2$ or $\lambda/4$ fundamental mode is chosen for the resonator length, then the resonator can be operated in a higher spatial mode, and thus the sensitive region and hence the signal-to-noise ratio can be increased. However, this is disadvantageous in that an increasing mode is often accompanied by a drop in the quality Q of the resonator, which is linked to a reduction in the signal strength. Moreover, this only allows measurement of a contiguous region of the data carrier. Measuring two non-adjacent positions on the data carrier is not possible, by contrast.

Broadening the stripline resonator leaves the resonant frequency constant to a first approximation; however, very broad resonators often do not allow the resonator impedance to be matched to the impedance of the signal source. This also is linked to the additional disadvantage that it is only possible to measure a contiguous region of the data carrier; by contrast, a measurement of two non-adjacent positions on the data carrier is not possible.

It is also possible to make use of the fact that the signal strength of a spin resonance measurement is proportional to the square root of the signal power supplied to the resonator. It is therefore advantageous to maximize the excitation signal power. However, this is only possible up to a specific, feature-dependent limit power $P_{opt}$. The signal is no longer increased once the power supplied to the resonator is increased beyond $P_{opt}$; instead, a drop in the signal or a distortion of the spin resonance line must even be expected. Therefore, the signal-to-noise ratio also cannot be arbitrarily increased by way of an increase in the supplied power.

SUMMARY

Using this as a starting point, the problem to be solved by the invention is that of specifying a generic sensor element with a large signal-to-noise ratio, which avoids the aforementioned disadvantages.

The invention provides a sensor element for testing, in particular testing the authenticity of, a planar data carrier having a spin resonance feature. For example, the planar data carrier can be a banknote. The sensor element contains a magnetic core with an air gap which is delimited in particular by two pole faces of the magnetic core and into which the planar data carrier can be introduced for testing purposes, a polarization device for creating a static magnetic flux in the air gap, and a resonator unit for exciting the spin resonance feature of the data carrier to be tested in the air gap. The spin resonance feature is preferably an ESR feature.

At the pole faces, the magnetic core is preferably made of a ferromagnetic material with a magnetic permeability $\mu_r \gg 1$, i.e. in particular $\mu_r$ greater than $1 \times 10^2$, but the pole faces can also be made of a paramagnetic material with $\mu_r \approx 1$, i.e. in particular $\mu_r$ is not more than $1+10^{-2}$.

In this case, the resonator unit comprises a signal source, in particular a single signal source, and a resonator device having a plurality of stripline resonators, which are fed simultaneously from the signal source. In this case, the stripline resonators have a planar design with a principal plane of extent that is plane-parallel to at least one of the pole faces of the magnetic core. By preference, the resonator unit comprises exactly one signal source and/or all stripline resonators of the resonator device are fed simultaneously from the same signal source.

As explained in more detail below, the use of a plurality of stripline resonators which are aligned thus and simultaneously fed from the same signal source allows a significant increase in the signal-to-noise ratio vis-à-vis the use of a single resonator. Moreover, this allows simple testing of not only contiguous spin resonance features but also spin resonance features with nonadjacent portions since the positions of the plurality of stripline resonators can readily be matched to the positions of the portions to be detected during the spin resonance measurement.

In principle, the stripline resonators used are characterized in particular in that their sensitive region is very easily accessible and that they have a very high filling factor for planar samples, such as those formed by the banknotes to be tested. The stripline resonators are sometimes referred to below as resonators purely for brevity.

Preferably, the plurality of stripline resonators are arranged in the form of a linear array or in two dimensions on the grid points of a regular grid, for example in a rectangular, hexagonal or line-by-line offset arrangement. Adjacent stripline resonators in different lines and/or columns of the array can be arranged equidistantly but can also have different distances from one another.

In an advantageous configuration, the plurality of stripline resonators form an N×1 array of N parallel-connected stripline resonators, where N≥2, in particular N=2, 3, 4 or 5.

In another, likewise advantageous configuration, the plurality of stripline resonators form a 1×M array of M series-connected stripline resonators, where M≥2, in particular M=2, 3, 4 or 5.

In a further advantageous configuration, the plurality of stripline resonators form an N×M array of stripline resonators partly connected in series and partly connected in parallel, where N≥2 and M≥2, in particular N=2, 3, 4 or 5 and/or M=2, 3, 4 or 5.

The stripline resonators of the resonator device advantageously have the same resonant frequency. The stripline resonators are preferably also designed and configured for testing the spin resonance feature in the same spatial mode of the excitation field, and particularly preferably the stripline resonators have an identical geometric shape, for example a square, a rectangular or a ringlike shape.

Advantageously, the polarization device is designed such that it creates a static magnetic flux in the air gap, which has substantially the same strength at all stripline resonators. Specifically, provision is advantageously made for the static magnetic flux at the location of the stripline resonators to have a maximum deviation of 2% or less.

The principal plane of extent of the stripline resonators expediently is oriented perpendicular to the direction of the static magnetic flux created by the polarization device. Within the scope of this description, the direction of the static magnetic flux is also referred to as the z-direction. The principal plane of extent of the stripline resonator then extends in the xy-plane perpendicular to the z-direction. In particular, provision is advantageously made for the principal plane of extent of the stripline resonators to be plane-parallel to the two pole faces of the magnetic core bounding the air gap.

Advantageously, the stripline resonators of the resonator device are all arranged in the same plane, the stripline resonators are in particular all arranged in a plane of a common carrier, for example a printed circuit board.

By preference, the resonator unit is advantageously designed and configured for operation of the signal source, in particular the single signal source, at a high power output, at which signal saturation occurs when the spin resonance feature is tested using a single one of the stripline resonators. Since the supplied signal power is distributed among the plurality of stripline resonators, the resonator unit can be operated at a significantly higher excitation power than a single resonator, without saturation effects occurring in the process. For example, if the resonator device contains K=N×M similar stripline resonators, then the excitation power of the signal source can be distributed equally among the K stripline resonators by way of suitable circuitry, and hence the resonator device overall can be fed with substantially K-times the excitation power of a single resonator. Thus, the signal-to-noise ratio can be increased by a factor of √K vis-à-vis a single resonator, without saturation effects occurring.

The arrangement of stripline resonators advantageously has a smaller areal extent than the data carrier to be tested, in particular a banknote to be tested.

In an advantageous configuration, the stripline resonators have a rectangular embodiment with an aspect ratio of less than 3:1.

The stripline resonators advantageously form independent electromagnetic modes of the excitation field, wherein the overall excitation field preferably has local minima between the stripline resonators.

The air gap advantageously has a height, i.e. a dimension in the z-direction, of less than 10 mm, preferably of less than 5 mm. This allows a particularly strong polarization field, i.e. a strong static magnetic flux, to be created in the air gap.

In an advantageous embodiment, the sensor element further comprises a modulation device for creating a time-varying magnetic modulation field in the air gap, wherein the modulation frequency is preferably equal in all stripline resonators of the resonator device. For example, the modulation frequencies at the location of any two stripline resonators deviate from one another by no more than 2%. The modulation device is advantageously formed by a single modulation coil arranged in the air gap, in particular by a single planar coil.

In a particularly advantageous configuration, the sensor element furthermore comprises a ramp coil for creating a ramp function of the static magnetic flux.

Advantageously, the resonator device is designed for the excitation of spin resonance signals at a frequency above 1 GHz, in particular between 1 GHz and 10 GHz. Compared to lower frequencies, this allows a higher spectral resolution and a stronger measurement signal.

The resonator device is also designed in particular for detecting spin resonance signals of the spin resonance feature. The stripline resonators of the resonator device can in particular capture a response signal of the spin resonance feature and output it to a detector. The spin resonances can be determined, for example, with a continuous wave (CW) method, a pulsed method, or a rapid scan method.

The stripline resonators can be operated both in reflection and in transmission when testing the data carrier. The advantage of the latter is that the signal branch requires no element such as a circulator which separates the signals propagating to and from the resonator.

Advantageously, the resonator device comprises a planar carrier, on which the stripline resonators are applied. Advantageously, the carrier is formed by a printed circuit board, allowing reproducible and cost-effective production. However, the use of carriers on the basis of ceramic, Teflon or hydrocarbons is also advantageous, especially for reducing dielectric losses in the carrier material.

The invention also contains a test apparatus for testing a planar data carrier, in particular a banknote, having a spin resonance feature, comprising a sensor element of the described type and comprising a transport device, which guides the planar data carriers to be tested along a transport path through the air gap of the magnetic core.

The transport device is designed and configured in particular for high-speed transport, for example between 1 m/s and 12 m/s, of the planar data carriers to be tested along the transport path.

The invention also contains a method for testing a planar data carrier, in particular a banknote, having a spin resonance feature by means of a sensor element of the described type or a test apparatus of the described type, wherein in the method a planar data carrier to be tested is guided along a transport path through the air gap of the magnetic core of the aforementioned sensor element, a static magnetic flux is created using the polarization device and a time-varying magnetic modulation field is created in the air gap preferably using a modulation device, and the plurality of stripline resonators of the resonator device are fed simultaneously by the signal source of the resonator unit, and the resonator device is used to excite the spin resonance feature of the data carrier to be tested.

In an advantageous conduct of the method, the resonator device is fed by the signal source with a high output power, at which signal saturation already occurs when the spin resonance feature is tested using a single one of the stripline resonators.

BRIEF DESCRIPTION OF THE DRAWINGS

Further exemplary embodiments and advantages of the invention will be explained below on the basis of the figures, the representation of which dispenses with reproduction that is to scale and in proportion in order to increase clarity.

In the drawing.

DETAILED DESCRIPTION OF VARIOUS EMBODIMENTS

Figure 1:
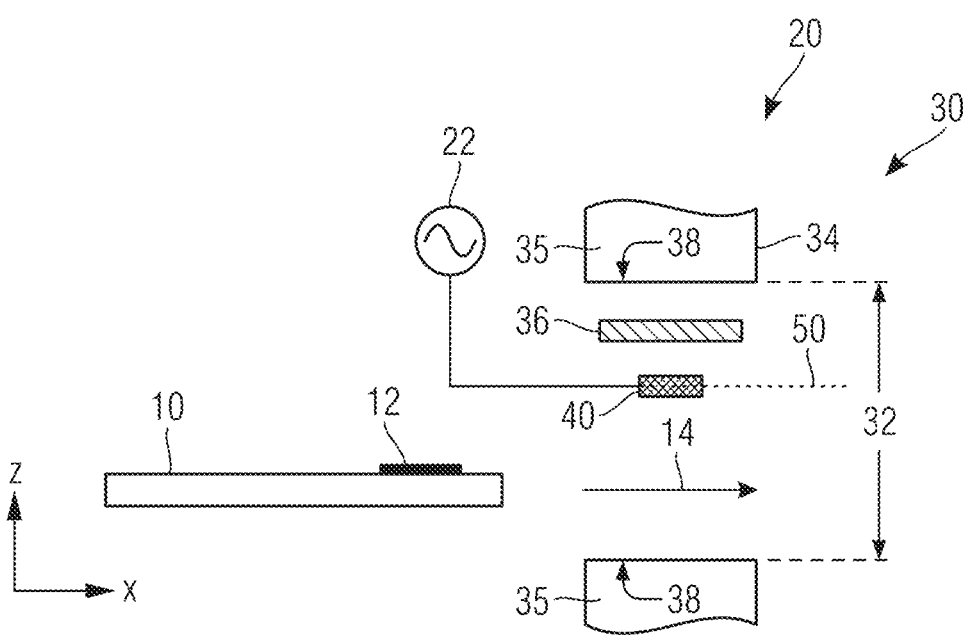
FIG. 1 schematically shows a test apparatus of a banknote processing system for measuring spin resonances of a banknote test object, FIG. 2 schematically shows a plan view of a resonator device according to one exemplary embodiment of the invention.

The invention is now explained using the example of testing the authenticity of banknotes. In this respect, FIG. 1 schematically shows a test apparatus 20 of a banknote processing system for measuring spin resonances of a banknote test object 10.

The banknote test object 10 has a spin resonance feature 12, the characteristic properties of which serve to verify the authenticity of the banknote. The test apparatus 20 contains a sensor element 30 having a magnetic core 35, which has an air gap 32 bounded by two pole faces 38, through which the banknote test object 10 is guided along a transport path 14 during the authenticity test.

To detect spin resonance signatures of the spin resonance feature 12, the sensor element 30 creates three different magnetic fields in a measurement region of the air gap 32.

Firstly, a polarization device 34 creates a static magnetic flux parallel to the z-axis in the measurement region. In order to create a strong polarization field, the height of the air gap in the z direction is advantageously less than 10 mm, in particular even less than 5 mm.

Secondly, a modulation device 36 generates a time-varying magnetic modulation field in the air gap, which also runs parallel to the z-axis and has a modulation frequency $f_{Mod}$ in the range between 1 kHz to 1 MHz. Finally, a resonator device 40 with stripline resonators creates an excitation field in the air gap, which induces the energy transitions between the spin energy levels in the spin resonance feature 12. The excitation field typically has frequencies above 1 GHz and is polarized perpendicular to the z-direction.

The frequency of the excitation field is tuned to the Larmor frequency of the spin resonance feature 12 to be detected, in order to measure its spin resonance signature and to allow it to be used for the authenticity test.

To this end, a resonator unit of the sensor element contains, in addition to the resonator device 40, a signal source 22, the excitation frequency few of which corresponds to the expected Larmor frequency of the spin resonance feature 12. The excitation signal from the signal source 22 is supplied simultaneously to the stripline resonators of the resonator device 40 and creates an alternating magnetic field of the frequency $f_{MW}$ there.

In addition to the aforementioned elements, the test apparatus 20 generally contains a detector diode for measuring the reflected radiofrequency power and an evaluation unit for evaluating and optionally displaying the measurement result. If the spin resonance feature 12 is in resonance at an incoupled frequency, the resonator quality changes, and with it the power reflected by the stripline resonators. On account of the modulation of the static polarization field brought about by the modulation device 36, the precise value of the Larmor frequency of the sample oscillates, and so the measurement signal obtained is amplitude-modulated with the modulation frequency.

A peculiarity of the resonator device 40 is that, in order to obtain a high signal-to-noise ratio, it contains not a conventional single resonator but an N×M array of stripline resonators with N and/or M greater than 1, wherein the stripline resonators, in particular all stripline resonators, are fed simultaneously by the same signal source 22. Within the scope of this description, N denotes the number of signal branches connected electrically in parallel, and M denotes the number of series-connected resonators per signal branch.

Figure 2:
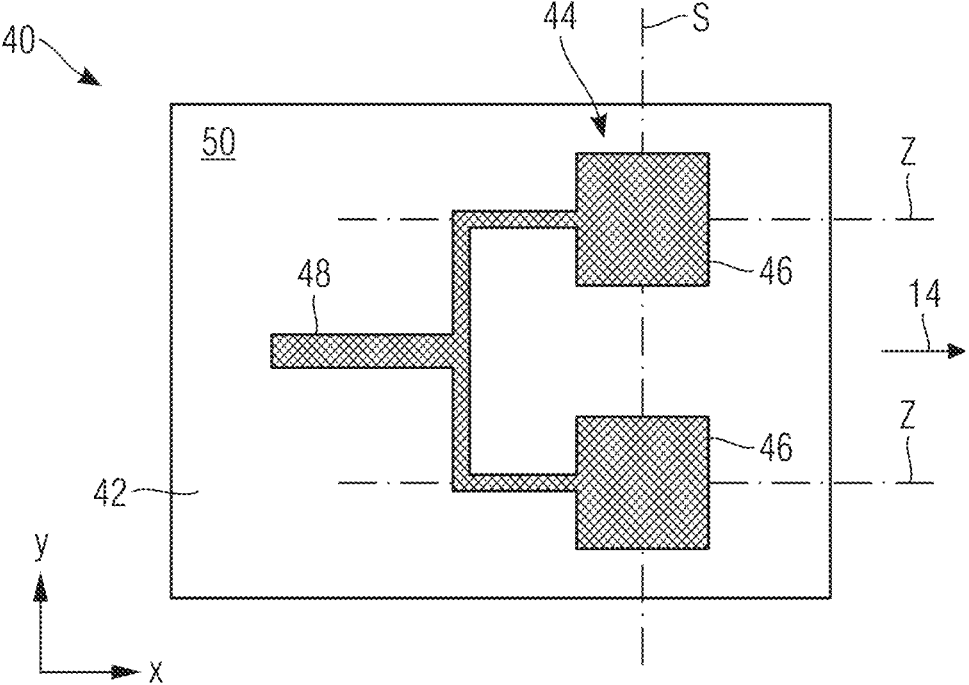

For a more detailed explanation, FIG. 2 schematically shows a plan view of the stripline resonator arrangement of a resonator device 40 according to one exemplary embodiment of the invention. In the resonator device 40, a 2×1 array 44 of stripline resonators 46 is constructed on a planar carrier, for example a printed circuit board 42. In the aforementioned sense, the arrangement in FIG. 2 forms a 2×1 array 44 with N=2 and M=1 since the array contains two resonators connected in parallel. The two stripline resonators 46 of the 2×1 array 44 are fed by the same signal branch 48 by way of the same signal source 22 of the resonator unit.

The resonator device 40 with the stripline resonators 46 has a planar design with a principal plane of extent 50 that is plane-parallel to the two pole faces 38 of the magnetic core 35. In this case, the stripline resonators 46 are all in the same plane and located in a homogeneous polarization field $B_0$. According to FIG. 2, the two resonators 46 are arranged along a line perpendicular to the transport direction 14 of the data carriers to be tested; however, in an alternative they can also be arranged successively in the transport direction or at an angle to the transport direction. An array of N>2 resonators electrically connected in parallel also need not have a linear design from a geometric point of view; instead, two-dimensional arrangements are also possible, for example on the grid points of a rectangular or hexagonal grid, or in other arrangements matched to the authenticity feature to be tested, for example along a circular circumference.

In comparison with a single resonator with the area of one of the two stripline resonators 46, the number of spins in the sensitive region of the 2×1 array 44 has doubled. If each of the two stripline resonators 46 of the array 44 is supplied with the same power as the single comparison resonator, then the signal-to-noise ratio is doubled vis-à-vis the single comparison resonator.

In the case of the circuitry 48 illustrated in FIG. 2, the signal power supplied to the array 44 by the signal source 22 is divided in equal parts among the two stripline resonators 46. The 2×1 array 44 can therefore be operated at twice the excitation power of a single comparison resonator without saturation effects occurring.

In addition to the 2×1 array shown in FIG. 2 for illustrative purposes, it is self-evident that there can also be larger single-column arrays, in general N×1 arrays with N>2, for example N=3, 4 or 5.

Figure 3:
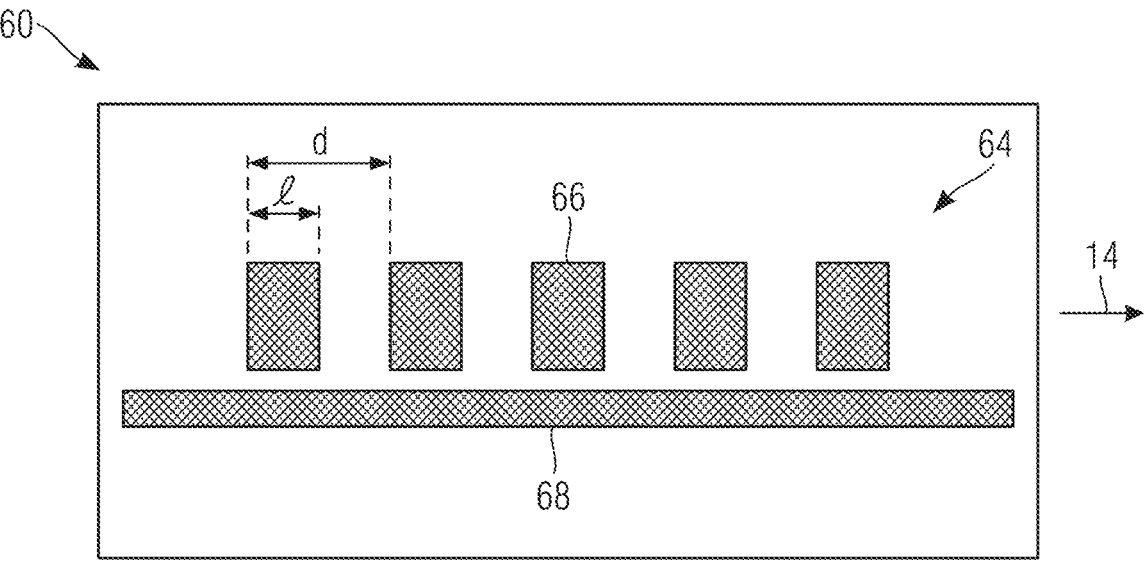
FIG. 3 shows a resonator device according to the invention designed for operation in transmission and having a serial 1×5 array made of five rectangular stripline resonators.

Moreover, 1×M arrays of stripline resonators are also possible, i.e. arrays consisting of only one line of a plurality (M≥2) of series-connected resonators. In this respect, FIG. 3 shows a resonator device 60 designed for operation in transmission and having a serial 1×5 array 64 made of five rectangular stripline resonators 66 fed by the same signal branch 68 by way of the same signal source (not shown here) as an exemplary embodiment. In the example, the stripline resonators 66 are arranged along a line in the transport direction 14 and each have a length l=λ/2 and a spacing d=λ in the transport direction 14, where λ denotes the wavelength of the incoupled radiofrequency signal $f_{MW}$. Alternatively, other geometric arrangements of the resonators are also possible in the case of a series-connected array, for example along a line perpendicular to the transport direction, or else two-dimensional arrangements, for example on the grid points of a rectangular or hexagonal grid.

Figure 4:
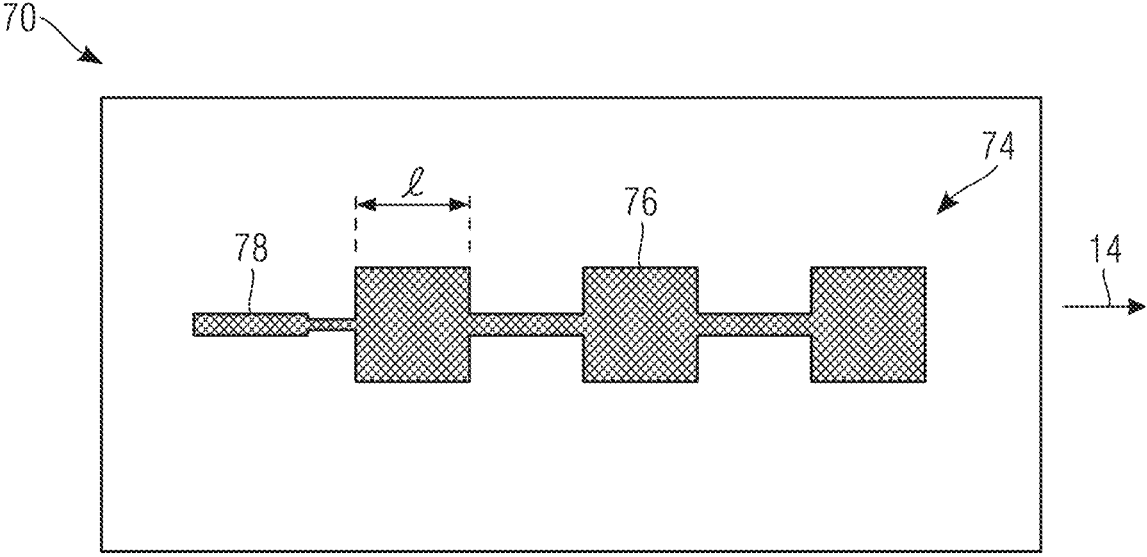
FIG. 4 shows a resonator device designed for operation in reflection and having a serial 1×3 array made of three square stripline resonators.

As a further exemplary embodiment of the invention, FIG. 4 shows a resonator device 70 designed for operation in reflection and having a serial 1×3 array 74 made of three square stripline resonators 76 of side length l=λ/2 fed by the same signal branch 78 by way of the same signal source.

The configurations of FIGS. 3 and 4 are also advantageous in that the sensitive region of the resonator device is increased vis-à-vis a single comparison resonator, and the maximally possible excitation power is increased.

In addition to the one-dimensional N×1 arrays and 1×M arrays shown, circuitry in which the stripline resonators form an N×M array with N≥2 and M≥2 and the stripline resonators are partly connected in series and partly connected in parallel is also advantageous. In this case, the resonators are preferably also arranged geometrically in a grid with N×M grid points, for example in the form of a rectangular grid, or with a line-by-line offset arrangement.

To demonstrate the advantages of sensor elements according to the invention with an array of stripline resonators, the behavior of a sensor element with a 2×1 array in a parallel configuration according to FIG. 2 was simulated and compared to a single resonator.

The stripline resonator array according to the invention and the single comparison resonator are each constructed on a printed circuit board of thickness 1.5 mm, the dielectric constant of which is 3.66. In each case, a square λ/2 stripline resonator with an edge length of 7.1 mm, corresponding to a resonant frequency of 9.8 GHz, is used as basic element.

Only one such basic element is present in the single comparison resonator. The impedance of the basic element is directly matched to 50Ω using a planar λ/4 impedance transformer, and the single resonator is fed by a 50Ω source with the aid of a circulator.

The stripline resonator array 44 according to the invention contains two basic elements 46 connected in parallel in the style of FIG. 2. The impedance of each basic element 46 is transformed to 100Ω using a λ/4 impedance transformer. A total impedance of 50Ω is obtained by subsequently connecting the two basic elements in parallel. The array 44 connected in parallel is fed by a 50Ω source with the aid of a circulator, and so both basic elements 46 are fed simultaneously by the same signal source.

Both the single comparison resonator constructed thus and the 2×1 array 44 were used to simulate a spin resonance measurement on a planar sample doped homogeneously with a spin resonance feature.

In this case, the 2×1 array 44 according to the invention is operated at twice the power of the single comparison resonator. The polarization field $B_0$ and the modulation field $B_{Mod}$ are identical in both measurements.

The signal-to-noise ratio was determined for both configurations and the ratio of the two signal-to-noise ratios $$\eta = SNR_{Array}/SNR_{Single\ resonator}$$

was ascertained as the statistic for the improvement by the present invention. Here, a value η=1.93 was obtained for the improvement factor; the signal-to-noise ratio of the stripline resonator array 44 according to the invention thus is nearly twice as high as the signal-to-noise ratio of the single comparison resonator.

The deviation from the maximally expected improvement $\eta_{ideal}$=2.0 is explained by additional losses in the coupling network of the array.

| List of reference signs | |
| --- | --- |
| 10 | Banknote test object |
| 12 | Spin resonance feature |
| 14 | Transport path |
| 20 | Test apparatus |
| 22 | Signal source |
| 30 | Sensor element |
| 32 | Air gap |
| 34 | Polarization device |
| 35 | Magnetic core |
| 36 | Modulation device |
| 38 | Pole faces |
| 40 | Resonator device |
| 42 | Printed circuit board |
| 44 | 2 × 1 array |
| 46 | Stripline resonators |
| 48 | Circuitry |
| 50 | Principal plane of extent |
| 60 | Resonator device |
| 64 | 1 × 5 array |

-continued

| List of reference signs | |
| --- | --- |
| 66 | Rectangular stripline resonators |
| 68 | Signal branch |
| 70 | Resonator device |
| 74 | 1 × 3 array |
| 76 | Square stripline resonators |
| 78 | Signal branch |

The invention claimed is:

1. A sensor element for testing a planar data carrier having a spin resonance feature, comprising:

a magnetic core having an air gap which is delimited by two pole faces of the magnetic core and into which the planar data carrier can be introduced for testing purposes, a polarization device for creating a static magnetic flux in the air gap, and a resonator unit for exciting the spin resonance feature of the data carrier to be tested in the air gap, wherein the resonator unit comprises a signal source, and a resonator device having a plurality of stripline resonators, which are fed simultaneously from the signal source, and in that the stripline resonators have a planar design with a principal plane of extent that is plane-parallel to at least one of the pole faces of the magnetic core.

2. The sensor element according to claim 1, wherein the resonator unit comprises exactly one signal source and all stripline resonators of the resonator device are fed simultaneously from the one signal source.

3. The sensor element according to claim 1, wherein the plurality of stripline resonators form an N×M array of N signal branches electrically connected in parallel with M series-connected stripline resonators per signal branch, where N and M are natural numbers and at least one of the values of N and M is greater than 1.

4. The sensor element according to claim 3, wherein the plurality of stripline resonators form an N×1 array of N parallel-connected stripline resonators, where N≥2.

5. The sensor element according to claim 3, wherein the plurality of stripline resonators form a 1×M array of M series-connected stripline resonators, where M≥2.

6. The sensor element according to claim 3, wherein the plurality of stripline resonators form an N×M array of stripline resonators partly connected in series and partly connected in parallel, where N≥2 and M≥2.

7. The sensor element according to claim 1, wherein the stripline resonators of the resonator device have the same resonant frequency.

8. The sensor element according to claim 1, wherein the polarization device creates a static magnetic flux in the air gap, which has substantially the same strength at all stripline resonators in that the static magnetic flux at the location of the stripline resonators has a maxi-mum deviation of 2% or less.

9. The sensor element according to claim 1, wherein the principal plane of extent is perpendicular to the direction of the static magnetic flux created by the polarization device, in that the principal plane of extent of the stripline resonators is plane-parallel to the two pole faces of the magnetic core bounding the air gap.

10. The sensor element according to claim 1, wherein the stripline resonators of the resonator device are all arranged in the same plane.

11. The sensor element according to claim 1, wherein the resonator unit is designed and configured for operation of the signal source at a high output power, at which signal saturation occurs when the spin resonance feature is tested using a single one of the stripline resonators.

12. The sensor element according to claim 1, wherein the arrangement of stripline resonators has a smaller areal extent than the data carrier to be tested.

13. The sensor element according to claim 1, wherein the stripline resonators have a rectangular embodiment with an aspect ratio of less than 3:1.

14. The sensor element according to claim 1, wherein the stripline resonators form independent electromagnetic modes of the excitation field, wherein the overall excitation field has local minimal between the stripline resonators.

15. The sensor element according to claim 1, wherein the air gap has a height of less than 10 mm.

16. The sensor element according to claim 1, wherein the sensor element has a modulation device for generating a time-varying magnetic modulation field in the air gap, wherein the modulation frequency for all of the stripline resonators of the resonator device is equal.

17. A test apparatus for testing a planar data carrier having a spin resonance feature, comprising:

a sensor element according to claim 1, and a transport device, which guides the planar data carriers to be tested along a transport path through the air gap of the magnetic core, wherein the transport device is advantageously designed and configured for high-speed transport of the planar data carriers to be tested along the transport path.

18. A method for testing a planar data carrier having a spin resonance feature, by means of a sensor element or a test apparatus according to claim 17, wherein in the method a planar data carrier to be tested is guided along a transport path through the air gap of the magnetic core of the aforementioned sensor element, a static magnetic flux is created using the polarization device and a time-varying magnetic modulation field is created in the air gap using a modulation device, and the plurality of stripline resonators of the resonator device are fed simultaneously by the signal source and the resonator device is used to excite the spin resonance feature of the data carrier to be tested.

19. The method according to claim 18, wherein the resonator device is fed by the signal source with a high output power, at which signal saturation occurs when the spin resonance feature is tested using a single one of the stripline resonators.

* * * * *